United States Patent [19]

Brown

[11] Patent Number: 5,936,627
[45] Date of Patent: Aug. 10, 1999

[54] METHOD AND SYSTEM FOR PERFORMING PERSPECTIVE DIVIDE OPERATIONS ON THREE-DIMENSIONAL GRAPHICAL OBJECT DATA WITHIN A COMPUTER SYSTEM

[75] Inventor: Patrick Richard Brown, Round Rock, Tex.

[73] Assignee: International Business Machines Corporation, Armonk, N.Y.

[21] Appl. No.: 08/808,408

[22] Filed: Feb. 28, 1997

[51] Int. Cl.[6] .................................................... G06F 17/20
[52] U.S. Cl. ............................................ 345/419; 345/433
[58] Field of Search ..................................... 345/427, 434, 345/419, 420, 425, 433, 441–443, 118, 154

[56] References Cited

U.S. PATENT DOCUMENTS

| 4,674,058 | 6/1987 | Lindbloom et al. | 364/518 |
|---|---|---|---|
| 5,204,944 | 4/1993 | Wolberg et al. | 395/127 |
| 5,475,802 | 12/1995 | Wescott et al. | 395/129 |
| 5,515,308 | 5/1996 | Karp et al. | 364/748 |
| 5,521,290 | 5/1996 | Sivam et al. | 530/391.5 |
| 5,557,719 | 9/1996 | Ooka et al. | 395/141 |
| 5,768,171 | 6/1998 | Chow | 364/765 |

*Primary Examiner*—Mark R. Powell
*Assistant Examiner*—Thu Nguyen
*Attorney, Agent, or Firm*—Volel Emile; Antony P. Ng; Andrew J. Dillion

[57] ABSTRACT

A method and system for performing perspective divide operations on three-dimensional graphics data within a computer system is disclosed. In accordance with the method and system of the present invention, a 3-D graphical image is represented by three-dimensional graphical object data via a number of vertices. In a first iteration, the following steps are performed concurrently: computing a set of clip coordinates for a vertex N, wherein the set of clip coordinates is a four-component vector $[x', y', z', w']$; refining an estimate value of $1/w'$ for a vertex N-1, wherein vertex N-1 is a vertex calculated one iteration previous to vertex N; and, generating a clip code for the vertex N-1. Then, the following steps are performed in a next iteration: performing a clip test on the set of clip coordinates for the vertex N; generating an estimate value of $1/w'$ for the vertex N; and computing a set of normalized device coordinates for the vertex N-1 utilizing a refined estimate value of $1/w'$ for the vertex N-1 and a set of clip coordinates for the vertex N-1. By so doing, perspective divide operations can be performed more efficiently.

15 Claims, 3 Drawing Sheets

METHOD AND SYSTEM FOR PERFORMING PERSPECTIVE DIVIDE OPERATIONS ON THREE-DIMENSIONAL GRAPHICAL OBJECT DATA WITHIN A COMPUTER SYSTEM

BACKGROUND OF THE INVENTION

1. Technical Field

The present invention relates to a method and system for data processing in general and, in particular, to a method and system for processing graphics data within a computer system. Still more particularly, the present invention relates to a method and system for performing perspective divide operations on three-dimensional graphical object data within a computer system.

2. Description of the Prior Art

Within a computer system, a three-dimensional (3-D) graphical object to be displayed on a screen of a video-display monitor is commonly built from a collection of vertices. Typically, each vertex is specified by three cartesian coordinates: x, y, and z, in a 3-D graphical object data set. Prior to display, each vertex of the graphical object has to undergo a series of transformations. The first transformation, called the modelling transformation, positions a vertex relative to a computational origin shared by all objects in a 3-D scene. The second transformation, called the viewing transformation, positions a vertex relative to the location and orientation of a viewer in front of the screen. The third transformation, called the projection transformation, accounts for optical effects such as perspective foreshortening, by positioning a vertex relative to the portion of space visible to the viewer, referred to as the view volume. The net effects of these three transformations are combined into a single transformation, which may be referred to as a vertex transformation.

Vertex transformation is performed in homogeneous coordinates in which each original vertex locations represented as a four-component vector [x, y, z, 1]. This four-component vector is then multiplied by a 4×4 matrix, resulting in another four-component vector [x', y', z', w'] that represents a vertex location relative to the view volume. The coordinates of this four-component vector are referred to as clip coordinates.

Subsequent to the vertex transformation, a so-called clip test is performed, in which each transformed vertex is checked against the boundaries of the view volume for determining whether or not the graphical object is visible to the viewer. A transformed vertex [x', y', z', w'] is visible to the viewer if and only if all of the following conditions are satisfied:

$$-w' \leq x' \leq w',$$

$$-w' \leq y' \leq w',$$

and $$-w' \leq z' \leq w'.$$

The results of these comparisons are combined to become an attribute for the vertex known as clip code. Each clip code is six-bits long, in which a "0" bit implies the corresponding inequality is satisfied while a "1" bit implies otherwise.

Each vertex that falls inside the view volume is then projected onto the screen by utilizing an operation called perspective divide. A perspective divide operation generates normalized device coordinates (NDCs) by converting a four-component clip coordinates [x', y', z', w'] into a three-component NDC [x'/w', y'/w', z'/w']. In an NDC, x'/w' and y'/w' specify the horizontal and vertical location of the vertex on the screen while z'/w' represents the relative distance of the vertex from the viewer and is utilized to properly display overlapping objects. To accomplish a realistic perspective effect, the vertex transformation operates in such a manner that w' is small for points near the viewer and large for points far away from the viewer.

After the perspective divide operation, an RGBA (red, green, blue, alpha) color is further computed for each vertex based on standard lighting equations. The color is computed to simulate realistic lighting effects. Finally, the graphical object is displayed on the screen by an operation known as rasterization. This rasterization operation is frequently performed by dedicated 3-D graphics hardware, but it can also be performed by software as well.

Under the prior art, the perspective divide operation is typically performed by multiplying each of the x', y', and z' coordinates by the reciprocal of w' coordinate. Because all clip coordinates (x', y', z', w') within a 3-D graphics systems are usually represented in floating-point numbers, the perspective divide operation as performed under the prior art becomes a very expensive operation. This is due to the fact that computing the reciprocal of a floating-point number typically requires a large number of processor cycles in most, if not all, processor architectures. For example, PowerPC™ 604 processor manufactured by the International Business Machines Corporation requires 18 processor cycles to perform a floating-point divide operation. Furthermore, during a floating-point divide operation, a processor typically cannot execute any other floating-point operations. This is true even for a processor with multiple functional units such as the PowerPC™ 604 processor. In such a case, other unrelated floating-point instructions must wait until the completion of the floating-point divide operation.

Thus, each floating-point divide operation makes the perspective divide step a major bottleneck in a vertex transformation pipeline. Not to mention, a floating-point divide operation may even prevent other non-dependent operations from execution because it ties up a functional unit of the processor. Consequently, it would be desirable to provide an improved method and system for performing perspective divide operations on 3-D graphical object data within a computer system such that the burden of the perspective divide operations upon the vertex transformation pipeline can be lessened.

SUMMARY OF THE INVENTION

In view of the foregoing, it is therefore an object of the present invention to provide an improved method and system for data processing.

It is another object of the present invention to provide an improved method and system for processing graphics data within a computer system.

It is yet another object of the present invention to provide an improved method and system for performing perspective divide operations on three-dimensional graphical object data within a computer system.

In accordance with the method and system of the present invention, a 3-D graphical image is represented by three-dimensional graphical object data via a number of vertices. In a first iteration, the following steps are performed concurrently: computing a set of clip coordinates for a vertex N, wherein the set of clip coordinates is a four-component vector [x', y', z', w']; refining an estimate value of 1/w' for a vertex N-1, wherein vertex N-1 is a vertex calculated one iteration previous to vertex N; and, generating a clip code for the vertex N-1. Then, the following steps are performed in a next iteration: performing a clip test on the set of clip coordinates for the vertex N; generating an estimate value of 1/w' for the vertex N; and computing a set of normalized device coordinates for the vertex N-1 utilizing a refined estimate value of 1/w' for the vertex N-1 and a set of clip coordinates for the vertex N-1. By so doing, perspective divide operations can be performed more efficiently.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be executed in a variety of computers under a number of different operating systems. The computer may be, for example, a personal computer, a midrange computer, or a mainframe computer. In addition, the computer may be a stand-alone system or part of a network such as a local-area network (LAN) or a wide-area network (WAN). For the purpose of illustration, a preferred embodiment of the present invention, as described below, is implemented on a graphical workstation having a PowerPC™ processor manufactured by International Business Machines Corporation.

Figure 1:
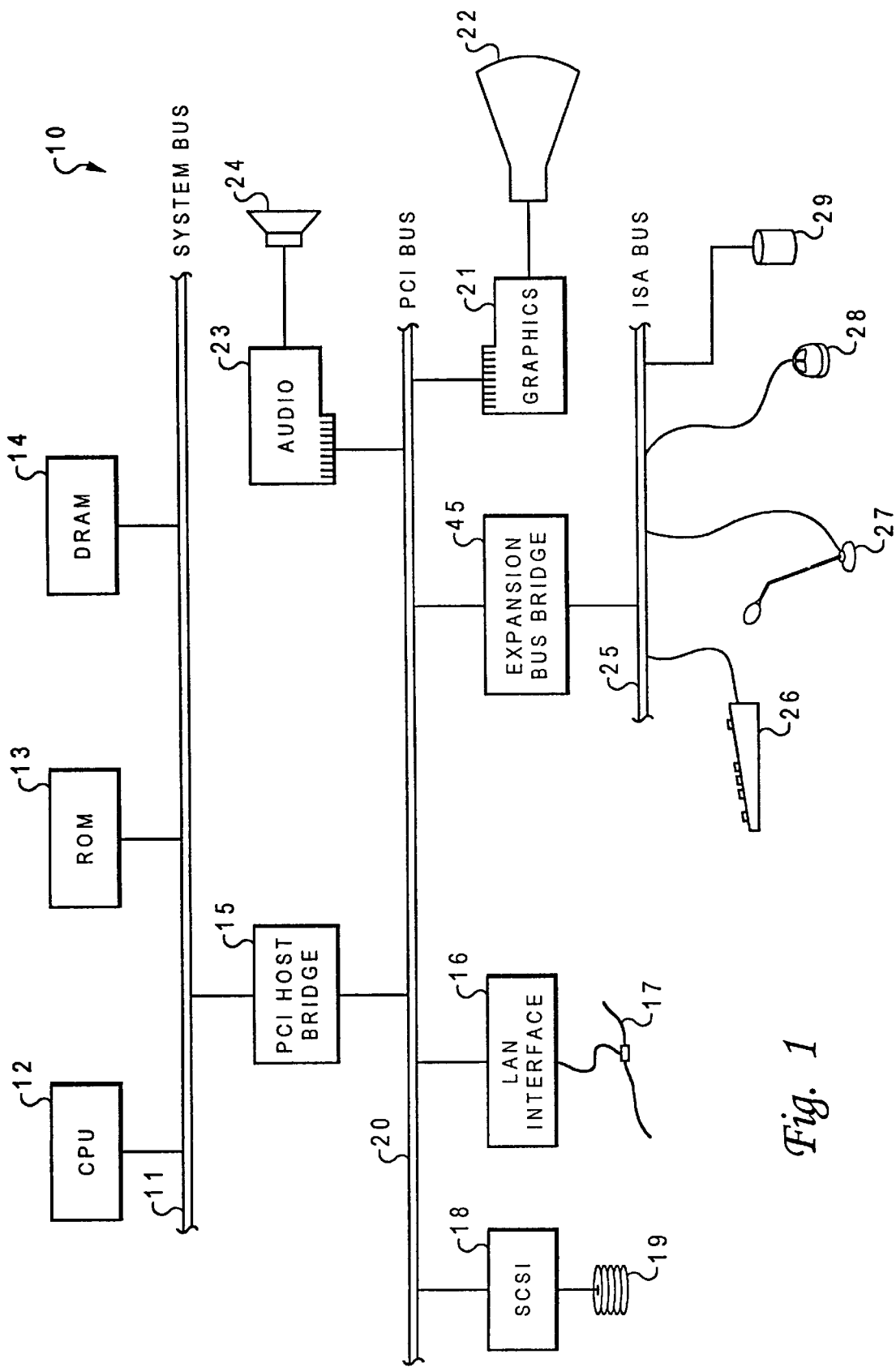
FIG. 1 is a block diagram of a graphical workstation that may utilize a preferred embodiment of the present invention.

Referring now to the drawings and in particular to FIG. 1, there is depicted a block diagram of a personal computer 10 that may utilize a preferred embodiment of the present invention. As shown, a central processing unit (CPU) 12, a read-only memory (ROM) 13, and a Dynamic Random Access Memory (DRAM) 14 are connected to a system bus 11 of a computer system 10. CPU 12, ROM 13, and DRAM 14 are also coupled to a PCI local bus 20 of computer system 10 through a PCI host bridge 15. PCI host bridge 15 provides a low latency path through which processor 12 may directly access PCI devices mapped anywhere within bus memory and/or I/O address spaces. PCI host bridge 15 also provides a high bandwidth path for allowing PCI devices to directly access DRAM 14.

Also attaching to PCI local bus 20 are LAN interface 16, small computer system interface (SCSI) 18, and expansion bus bridge 45. LAN interface 16 is for connecting computer system 10 to a local-area network 17. SCSI 18 is utilized to control high-speed SCSI disk drive 19. Expansion bus bridge 45, such as a PCI-to-ISA bus bridge, may be utilized for coupling ISA bus 25 to PCI local bus 20. As shown, a keyboard 26, a microphone 27, and a mouse 28 are attached to ISA bus 25 for performing certain basic I/O functions. In addition, an audio adapter 23 is attached to PCI local bus 20 for controlling audio output through speaker 24. A graphics adapter 21 is also attached to PCI local bus 20 for controlling visual output through video display monitor 22.

Figure 2:
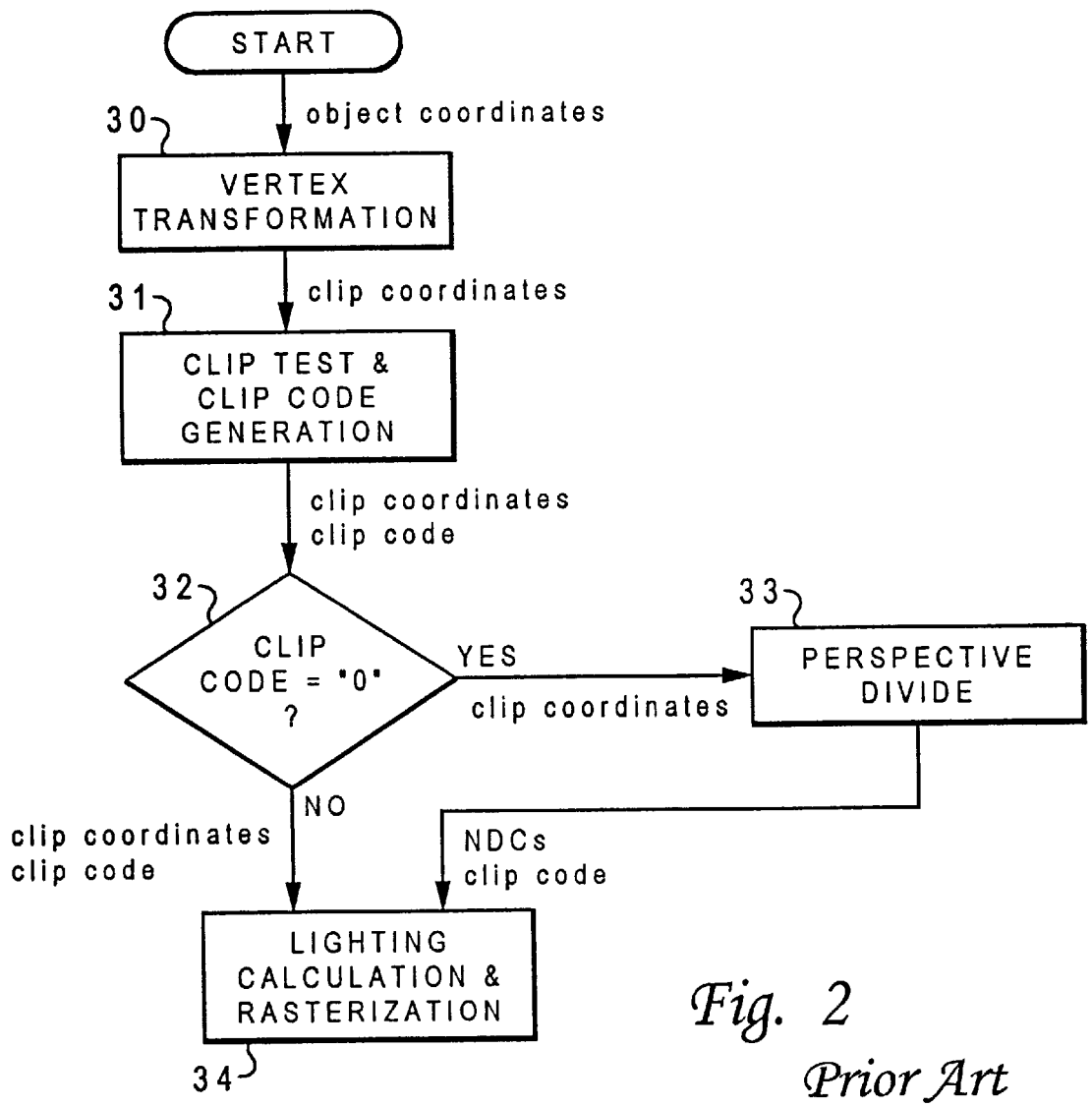
FIG. 2 is a high-level logic flow diagram of a method for performing perspective divide operations on graphical object data under the prior art.

With reference now to FIG. 2, there is illustrated a high-level logic flow diagram of a method for performing perspective divide operations on graphical object data under the prior art. First, a set of clip coordinates is generated by multiplying the object coordinates of a vertex by a 4×4 matrix, as shown in step 30. Next, a clip test (i.e., six inequality comparisons) is performed on the clip coordinates to generate an integer-valued clip code, as illustrated in step 31. A determination is then made as to whether or not the clip code is "0" (i.e., within view volume), as depicted in step 32. If any of the bits in the clip code is not "0," that means the vertex is outside the view volume, then the process proceeds to step 34 for lighting calculations and rasterization, thereby avoiding the possible unnecessary expense of the perspective divide operation.

However, if all the bits in the clip code are "0's," that means the vertex is inside the view volume, then a perspective divide operation will be performed on the clip coordinates, as shown in step 33. As mentioned above, the perspective divide operation includes a divide instruction for computing 1/w', and three multiply instructions for deriving a set of normalized device coordinates (NDCs)—x'/w', y'/w', and z'/w'. Finally, lighting calculations and rasterization operation are performed utilizing the computed NDCs, as depicted in step 34.

Figure 3:
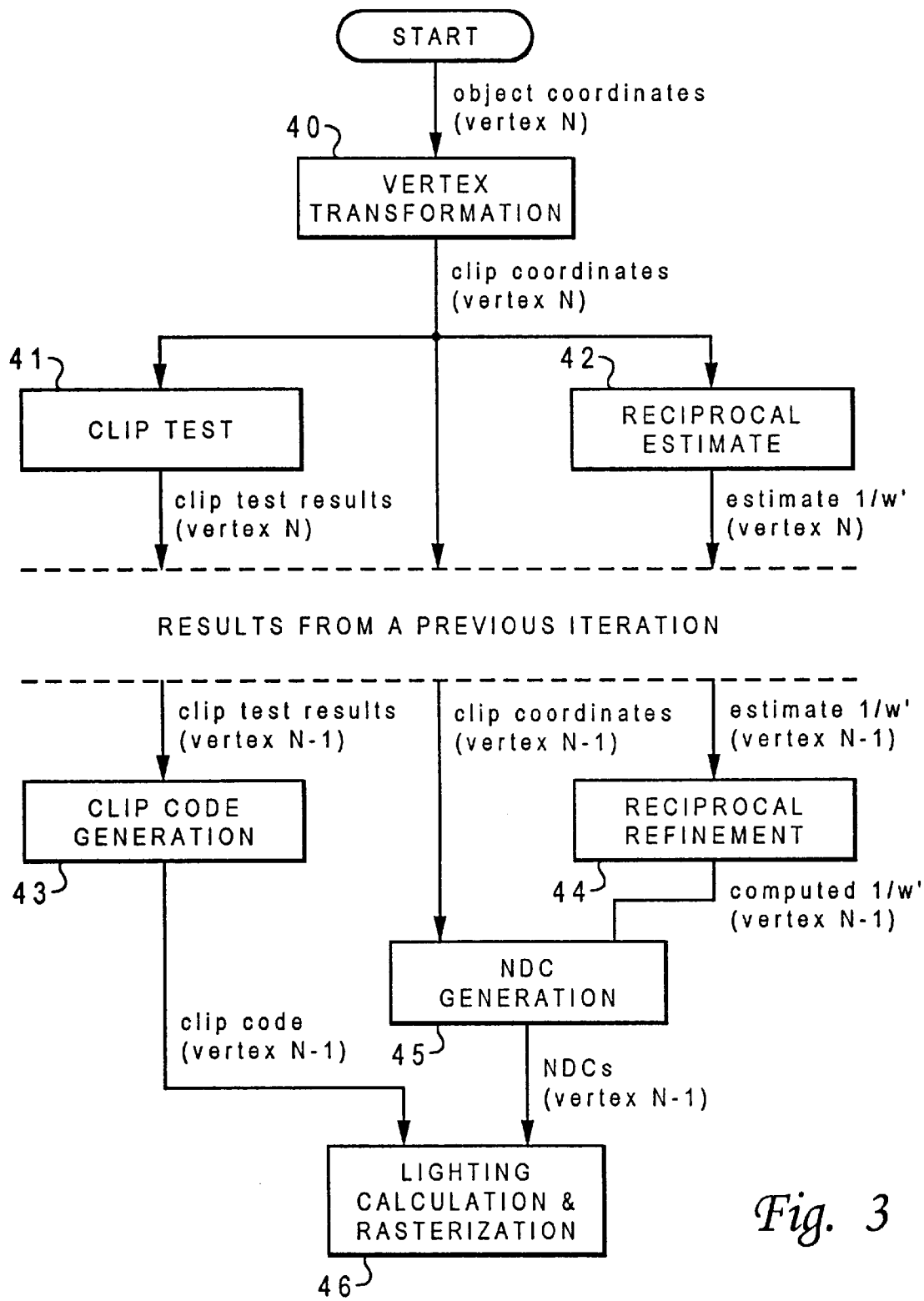
FIG. 3 is a high-level logic flow diagram of a method for performing perspective divide operations on graphical object data in accordance with a preferred embodiment of the present invention.

Referring now to FIG. 3, there is illustrated a high-level logic flow diagram of a method for performing perspective divide operations on graphical object data in accordance with a preferred embodiment of the present invention. First, a set of clip coordinates is generated by multiplying a vertex N by a 4×4 matrix, as shown in step 40. The results are a set of clip coordinates for vertex N. Next, a clip test is performed on the clip coordinates for vertex N, as depicted in step 41. The results are a set of clip test results for vertex N stored in a register, such as a condition register of the PowerPC™ processor. No clip code is generated in step 41. A Reciprocal Estimate is performed, in step 42, by taking the clip coordinate w' of vertex N and estimating a 1/w' value for vertex N. The details for performing reciprocal estimate will be further discussed infra.

In step 43, the clip test results for vertex N-1 previously generated in step 41 are utilized to produce a clip code for vertex N-1. In the meantime, a Reciprocal Refinement is performed, in step 44, to refine the estimate of 1/w' for vertex N-1 previously generated from step 42 to the actual value of 1/w' for vertex N-1. NDC Generation, as depicted in step 45, utilizes the clip coordinates for vertex N-1 previously generated from step 40 and the 1/w' for vertex N-1 generated from step 44 to produce a set of normalized device coordinates (x'/w', y'/w', z'/w') for vertex N-1. [Note: Vertex N-1 is a vertex calculated one iteration before the calculation of a vertex N.] The resulting NDCs and clip codes are utilized in rasterization, as depicted in step 46.

Processing steps from step 40 to step 46 are considered as one iteration. Steps 40, 41, and 42 perform operations on a vertex N while steps 43, 44, and 45 perform operations based on the results obtained from a previous cycle on vertex N-1. As a preferred embodiment of the present invention, the only sequentiality requirements during each iteration are:

step 41 must be completed after step 40, step 42 must be completed after step 40, and step 45 must be completed after step 44.

In addition, steps 40, 43, and 44 are performed concurrently while steps 41, 42, and 45 are also performed concurrently.

The iterative approach utilized to perform reciprocal estimate (step 42 in FIG. 3) for evaluating the computationally expensive function 1/w' is described below. Under the IEEE 754 format, a normal floating-point number, such as w', is represented by three components, namely, a sign, an exponent, and a mantissa, as follows:

$$w' = (-1)^{sign} \times 2^{exp} \times \text{mantissa}$$

The most significant bit of the floating-point number is the sign bit. The next eight bits represent the exponent. The exponent is computed by treating the exponent bits as an unsigned integer less 127. The mantissa is computed by extracting the 23 least significant bits, dividing by $2^{23}$, and adding 1.0.

This algorithm computes 1/w' in two parts by rewriting the IEEE decomposition as follows:

$$1/w' = ((-1)^{sign} * 2^{-exp}) * 1/\text{mantissa}$$

The value for the first part $((-1)^{sign} \times 2^{-exp})$ is computed in three steps. First, the bits utilized to represent the IEEE floating-point value w' are loaded into a fixed-point register. Second, the exponent bits are extracted. If exp' denotes the 8-bit unsigned value holding the exponent bits of w', then:

$$\exp = \exp' - 127 \Rightarrow -\exp = 127 - \exp'$$

To obtain the exponent bits in the IEEE representation of $2^{exp}$, 127 is added, so that the exponent bits of $2^{exp}$ are represented as 254−exp'. Thus, the non-exponent bits of $2^{exp}$ are masked off and the result is subtracted from 254. Third, the sign bit is merged in with the remaining bits of $2^{-exp}$. The result is stored to the system memory and then loaded into a floating-point register.

Note that the computation of $((-1)^{sign} * 2^{-exp})$ does not correctly handle the case where exp' is 255 (in which case 254−exp is equal to −1). All IEEE floating-point values with such an exponent are special cases representing either infinitely large numbers or software exceptions. These values are not normally generated by a floating-point graphics pipeline, and as such do not necessarily have to be handled correctly.

The second part of computing 1/w' is to compute 1/mantissa. By the IEEE definition mentioned above, mantissa is a floating-point number between 1.0 and 2.0. The first step for computing 1/mantissa is to generate an estimate for 1/mantissa in which the error is less than $2^{-6}$. This is done by taking the seven most significant bits of the mantissa of w' (should be loaded into a fixed-point register already) as an index into a precalculated table of estimates. The range of this table of estimates is defined by the seven most significant bits, with the remaining 16 bits of the 23 bits mantissa as either one or zero. Because the accuracy of each estimate determination is dictated by the size of the table, it is important to have a table of estimates sufficiently large to produce an estimate whose error is less than $2^{-6}$ for the present invention.

In the reciprocal refinement step 44 of FIG. 3, a refined estimate, est', is generated from the initial estimate, est, of 1/mantissa by evaluating the following expression:

$$\text{est}' = \text{est} * (2.0 - \text{mantissa} \times \text{est})$$

This evaluation is done by two floating-point instructions. Because the error in the initial estimate is less than $2^{-6}$, this algorithm guarantees that the error in the refined estimate to be less than $2^{-12}$. This refined estimate is further refined in the same manner. The error in the resulting value is guaranteed to be less than $2^{-24}$, which is roughly equal to the overall error in the IEEE floating-point representation. The twice-refined estimate can be utilized directly as the exact value of 1/mantissa.

The final value of 1/w' is computed by multiplying $((-1)^{sign} * 2^{-exp})$ by the iteratively computed value of 1/mantissa. This result is then separately multiplied by x', y', and z' in step 45 of FIG. 3 to complete the perspective divide operation.

As has been described, the present invention provides an improved method for performing perspective divide operations on three-dimensional graphical object data within a computer system. It is shown that the computation of 1/w' in the perspective divide operation (step 33 in FIG. 2) can be decomposed from one computationally expensive floating-point divide instruction into a number of less expensive fixed-point and floating-point instructions. Although delays would still be incurred because some instructions must wait on the results of previous dependent instructions, the present invention eliminates these delays by removing many of the dependencies between the components of the vertex transformation pipeline. The present invention thus allows the interleaving of the instructions of the perspective divide operation with many of the remaining instructions of the vertex transformation pipeline. The result of the interleaving is a loop in which operations are performed on two vertices (vertex N-1 and vertex N) concurrently.

It is further shown that the clip test and clip code generation operation (step 31 of FIG. 2) can be decomposed into two separate steps (steps 41, 43 of FIG. 3). Because the clip code generation step for a given vertex depends on the results of the clip test, the instructions necessary to generate a clip code incur delays when executed immediately after the comparisons steps in the clip test. In addition, the multiple conditional branches typically utilized to generate a clip code result in poor processor utilization when executed in sequence. The present invention eliminates these delays by removing the dependencies between the clip test and the clip code generation. As a result, the instructions composing the clip test and the clip code generation can be interleaved with other instructions in the vertex transformation pipeline, resulting in increased overall performance. The result of the interleaving is again a loop in which operations are performed on two vertices (vertex N-1 and vertex N) concurrently.

The prior art method requires steps 30, 31, and 33 in FIG. 2 to be performed sequentially. Thus, the prior art method suffers delays that are inherent within steps 31 and 33. The present invention overcomes these difficulties inherent in the prior art method. First, because step 43 utilizes previously computed results, the latencies involved in step 31 of FIG. 2 no longer exist. Further, the reciprocal refinement in step 44 requires only four floating-point instructions, instead of 18 in the prior art. During the reciprocal refinement process, other useful operations may still be performed within the processor. Because the perspective divide step is far less expensive, it can be done prior to complete generation and testing of the clip code (step 32 of FIG. 2).

Like the prior art, vertices are processed in a looping fashion under the present invention. Unlike the prior art, the present invention allows parts of two vertices to be processed during each iteration of the loop. Thus, the present invention removes the latencies and relaxes the sequentiality requirement associated with the prior art method.

While the invention has been particularly shown and described with reference to a preferred embodiment, it will be understood by those skilled in the art that various changes in form and detail may be made therein without departing from the spirit and scope of the invention.

What is claimed is:

1. A method for performing perspective divide operations on three-dimensional graphical object data within a computer system, wherein said three-dimensional graphical object data represents an image via a plurality of vertices, said method comprising the steps of:

first iteration:
  computing a set of clip coordinates for a vertex N, wherein said set of clip coordinates is a four-component vector [x', y', z', w'];
  refining an estimate value of 1/w' for a vertex N-1, wherein said vertex N-1 is a vertex calculated one iteration previous to said vertex N; and second iteration:
  generating an estimate value of 1/w' for said vertex N;
  computing a set of normalized device coordinates for said vertex N-1 utilizing said refined estimate value of 1/w' for said vertex N-1 and a set of clip coordinates for said vertex N-1, such that said perspective divide operations can be performed more efficiently.

2. The method according to claim 1, wherein said first iteration further includes a step of generating a clip code for said vertex N-1 and said second iteration further includes a step of performing a clip test on said set of clip coordinates for said vertex N.

3. The method according to claim 1, wherein said first iteration is performed before said second iteration.

4. The method according to claim 1, wherein said step of computing a set of clip coordinates further includes a step of computing a set of clip coordinates by a modelling transformation, a viewing transformation, and a projection transformation.

5. The method according to claim 1, wherein said step of performing a clip test further includes a step of performing six inequality comparisons.

6. A computer system for performing perspective divide operations on three-dimensional graphics data, comprising:

first means for:
  computing a set of clip coordinates for a vertex N, wherein said set of clip coordinates is a four-component vector [x', y', z', w'];
  refining an estimate value of 1/w' for a vertex N-1, wherein said vertex N-1 is a vertex calculated one iteration previous to said vertex N; and second means for:
  generating an estimate value of 1/w' for said vertex N;
  computing a set of normalized device coordinates for said vertex N-1 utilizing said refined estimate value of 1/w' for said vertex N-1 and a set of clip coordinates for said vertex N-1, such that said perspective divide operations can be performed more efficiently.

7. The computer system according to claim 6, wherein said first means further includes a means for generating a clip code for said vertex N-1 and said second means further includes a means for performing a clip test on said set of clip coordinates for said vertex N.

8. The computer system according to claim 6, wherein said first means is utilized before said second means.

9. The computer system according to claim 6, wherein said computing a set of clip coordinates function of said first means further includes a means for computing a set of clip coordinates by a modelling transformation, a viewing transformation, and a projection transformation.

10. The computer system according to claim 6, wherein said performing a clip test function of said second means further includes a means for performing six inequality comparisons.

11. A computer program product residing on a computer usable medium for performing perspective divide operations on three-dimensional graphics data within a computer system, said computer product comprising:

first program code means for:
  computing a set of clip coordinates for a vertex N, wherein said set of clip coordinates is a four-component vector [x', y', z', w'];
  refining an estimate value of 1/w' for a vertex N-1, wherein said vertex N-1 is a vertex calculated one iteration previous to said vertex N; and second program code means for:
  generating an estimate value of 1/w' for said vertex N;
  computing a set of normalized device coordinates for said vertex N-1 utilizing said refined estimate value of 1/w' for said vertex N-1 and a set of clip coordinates for said vertex N-1, such that said perspective divide operations can be performed more efficiently.

12. The computer program product according to claim 11, wherein said first program code means further includes a program code means for generating a clip code for said vertex N-1 and said second program code means further a program code means further includes a program code means for performing a clip test on said set of clip coordinates for said vertex N.

13. The computer program product according to claim 11, wherein said first program code means is executed before said second program code means.

14. The computer program product according to claim 11, wherein said computing a set of clip coordinates function of said first program code means further includes a program code means for computing a set of clip coordinates by a modelling transformation, a viewing transformation, and a projection transformation.

15. The computer program product according to claim 11, wherein said performing a clip test function of said second program code means further includes a program code means for performing six inequality comparisons.

* * * * *